United States Patent
Kurihara et al.

(10) Patent No.: US 6,507,112 B1
(45) Date of Patent: Jan. 14, 2003

(54) SEMICONDUCTOR DEVICE WITH AN IMPROVED BONDING PAD STRUCTURE AND METHOD OF BONDING BONDING WIRES TO BONDING PADS

(75) Inventors: Toshimichi Kurihara, Tokyo (JP); Tetsu Toda, Shiga (JP); Shigeki Tsubaki, Shiga (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 09/942,729

(22) Filed: Aug. 31, 2001

(30) Foreign Application Priority Data

Jan. 9, 2000 (JP) .......................... 2000-264808

(51) Int. Cl.[7] .......................... H01L 23/48; H01L 23/52; H01L 29/40; H01L 21/44
(52) U.S. Cl. .......................... 257/734; 257/748; 257/750; 257/751; 257/735; 257/737; 438/615; 438/614
(58) Field of Search .................. 257/748, 750, 257/751, 737, 735, 734; 438/615, 614, 613, 612

(56) References Cited

U.S. PATENT DOCUMENTS

| | | | | | |
|---|---|---|---|---|---|
| 3,585,461 | A | * | 6/1971 | Eynon et al. | 257/737 |
| 4,093,110 | A | * | 6/1978 | Johnson | 181/230 |
| 5,036,383 | A | * | 7/1991 | Mori | 257/751 |
| 5,455,195 | A | * | 10/1995 | Ramsey et al. | 228/4.5 |
| 5,734,200 | A | * | 3/1998 | Hsue et al. | 257/751 |
| 5,976,964 | A | * | 11/1999 | Ball | 438/123 |

* cited by examiner

Primary Examiner—Olik Chaudhuri
Assistant Examiner—Timothy Sutter
(74) Attorney, Agent, or Firm—Young & Thompson

(57) ABSTRACT

The present invention provides a bonding structure between a bonding pad and a bonding portion of a bonding wire made of an Au-base material, wherein said bonding pad further comprises: a base layer; at least a barrier layer overlying said base layer; and a bonding layer overlying said at least barrier layer, said bonding layer including an Al-base material, and wherein said bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

19 Claims, 7 Drawing Sheets

SEMICONDUCTOR DEVICE WITH AN IMPROVED BONDING PAD STRUCTURE AND METHOD OF BONDING BONDING WIRES TO BONDING PADS

BACKGROUND OF THE INVENTION

1. Field of the Invention

The present invention relates to a semiconductor device, and more particularly to a bonding pad structure of a semiconductor device and a method of bonding a bonding wire to a bonding pad.

2. Description of the Related Art

A semiconductor substrate is mounted on a printed circuit board, wherein bonding pads of the semiconductor substrate are bonded through bonding wires to lead frames of the printed circuit board. In view of the LSI manufacturing processes, it is preferable that the bonding pads are made of the same metal as internal wirings or interconnections of the semiconductor substrate. For example, Al or Al—Cu alloy are available. In view of the cost performance, the bonding wires are usually made of Al or Al—Si alloy.

Both the bonding pads and the bonding wires made of the Al-based materials provide an advantage in reduction of the manufacturing cost. If, however, the semiconductor device is applied to the high out device, then the bonding wires receive a high density current, resulting in a possibility of disconnection of the bonding wires. In order to avoid this problem, it is effective to increase a sectioned area or a diameter of the bonding wires. This increase in sectioned area or diameter of the bonding wires is, however, unsuitable for the increase in the density of the integration of the semiconductor device.

Alternatively, Au or Au alloy is also available for the bonding pads and the bonding wires. These Au-base materials are superior in anti-corrosion, and also lower in resistivity than Al, for which reason the Au-based bonding wires have a relatively high reliability without disconnection due to the high density current application. A disadvantage with use of the Au-base materials is that the Au-based bonding pads results in the increase of the manufacturing cost.

To avoid the increase of the manufacturing cost, it was proposed that the Al-base material is used for the bonding pads, and the Au-base material is used for the bonding wires. Since the Au-based bonding wires have a low resistance, it is possible to reduce the diameter or the sectioned area of the wires to take a large inductance. This means it easy to take an impedance matching.

The followings are advantages and disadvantages of the possible combinations in use of the Al and Au for the bonding pads and the bonding wires.

If Al is used for the bonding pads and Au is used for the bonding wires, then the bonding is carried out by an Al—Au alloy bonding, thereby providing advantages in a low manufacturing cost and a good impedance matching due to reduction in diameter of the bonding wires and an enlarged inductance. A disadvantage is that a bonding resistance is increased at a high temperature.

If Au is used for both the bonding pads and the bonding wires, then the bonding is carried out by a thermal compression bonding, thereby providing an advantage in a high thermal stability and also a disadvantage in high manufacturing cost.

If Al is used for both the bonding pads and the bonding wires, then the bonding is carried out by a thermal compression bonding, thereby providing advantages in a high thermal stability and low manufacturing cost and also a disadvantage in a large diameter of the bonding wires in view of avoiding the disconnection of the high density current application, The combined use of the Al-base material for the bonding pads and the Au-base material for the bonding wires provides a disadvantage in that a brittle Al—Au alloy is formed at a junction interface of the Al-based bonding pads and the Au-based bonding wires at a relatively low temperature, for example, in the range of 150–200° C. Thus, during a high temperature condition caused by high output driving of the semiconductor device, the brittle Al—Au alloy is formed at the junction interface, whereby a resistance of the junction between the Al-based bonding pads and the Au-based bonding wires increases and the bonding strength decreases.

The temperature in the normal use of the semiconductor device is only about 80–90° C. Under this low temperature condition, the brittle Al—Au alloy is not grown after the Al-based bonding pads and the Au-based bonding wires have been bonded. The temperature in the high output use of the semiconductor device is sometimes over 150° C. Under this high temperature condition, the brittle Al—Au alloy is grown up even after the Al-based bonding pads and the Au-based bonding wires have been bonded. As a result, the junction resistance is remarkably increased. The bonding strength is weaken. This problem will further be described in detail.

FIG. 1 is a side view of a conventional wire-bonding structure between a bonding pad on a semiconductor device and a lead frame on a printed circuit board. FIG. 2 is a fragmentary cross sectional view of a bonding interface between a bonding wire and a bonding pad immediately after the bonding process and before the high output driving of the semiconductor device. FIG. 3 is a fragmentary cross sectional view of a bonding interface between a bonding wire and a bonding pad after the high output driving of the semiconductor device.

As illustrated in FIG. 1, bonding pads 2 having a thickness of about 1 micrometer are provided on a surface of a semiconductor device 1 which is placed on a printed circuit board 10. The bonding pads 2 are bonded through bonding wires 3 to leads frames 4 of the printed circuit board 10. The bonding pads 2 are made of an Al-base material. The bonding wire 3 is made of an Au-base material.

As shown in FIG. 2, the bonding wire 3 has a ball 6 which is bonded with the bonding pad 2 by a thermal compression bonding. The bonding wire 3 is further bonded to the lead frame 4 by use of a bonding tool 5. The ball 6 of the bonding wire 3 digs into the bonding pad 2 by the thermal compression bonding, whereby an Au—Al alloy layer 10 is formed on a bonding interface between the ball 6 of the bonding wire 3 and the bonding pad 2.

FIG. 3 illustrates the grown Au—Al alloy layer 10 on the bonding interface after the high output driving of the semiconductor device at a high temperature for a long time. Under the high temperature condition, the Au—Al alloy layer 10 is grown up to increase the thickness uniformly. The Au—Al alloy layer 10 is higher in resistivity than the bonding pad 2 and the bonding wire 3. The current flows through the Au—Al alloy layer 10 in the thickness direction, for which reasons the increase in thickness of the Au—Al alloy layer 10 increases the resistance, to which the current senses. Namely, the increase in thickness of the Au—Al alloy layer 10 increases the bonding resistance between the bonding pad 2 and the bonding wire 3. Further, a bonding deterioration also increases the bonding resistance between the bonding pad 2 and the bonding wire 3.

In the above circumstances, the development of a novel bonding structure between a bonding pad and a bonding wire free from the above problems is desirable.

SUMMARY OF THE INVENTION

Accordingly, it is an object of the present invention to provide a novel bonding structure between a bonding pad and a bonding wire, wherein the bonding structure makes a semiconductor device free from the above problems.

It is a further object of the present invention to provide a novel bonding structure between a bonding pad and a bonding wire, which suppresses an increase in resistance of a boning part between the bonding pad and the bonding wire under a high temperature condition.

It is a still further object of the present invention to provide a novel bonding structure between a bonding pad and a bonding wire, which suppresses a weakening a bonding strength between the bonding pad and the bonding wire under a high temperature condition.

It is yet a further object of the present invention to provide a novel bonding pad bonded with a bonding wire, wherein the bonding pad makes a semiconductor device free from the above problems.

It is a further object of the present invention to provide a novel bonding pad bonded with a bonding wire, wherein the bonding pad suppresses an increase in resistance of a boning part between the bonding pad and the bonding wire under a high temperature condition.

It is a still further object of the present invention to provide a novel bonding pad bonded with a bonding wire, wherein the bonding pad suppresses a weakening a bonding strength between the bonding pad and the bonding wire under a high temperature condition.

It is yet a further object of the present invention to provide a novel semiconductor device having an improved bonding structure between a bonding pad and a bonding wire, which suppresses an increase in resistance of a boning part between the bonding pad and the bonding wire under a high temperature condition.

It is a still further object of the present invention to provide a novel semiconductor device having an improved bonding structure between a bonding pad and a bonding wire, which suppresses a weakening a bonding strength between the bonding pad and the bonding wire under a high temperature condition.

It is yet a further object of the present invention to provide a novel semiconductor device having an improved bonding pad bonded with a bonding wire, wherein the bonding pad makes a semiconductor device free from the above problems.

It is a still further object of the present invention to provide a novel method of bonding a bonding pad and a bonding wire, wherein the bonding method makes a semiconductor device free from the above problems.

It is a further object of the present invention to provide a novel method of bonding a bonding pad and a bonding wire, which suppresses an increase in resistance of a boning part between the bonding pad and the bonding wire under a high temperature condition.

It is a still further object of the present invention to provide a novel method of bonding a bonding pad and a bonding wire, which suppresses a weakening a bonding strength between the bonding pad and the bonding wire under a high temperature condition.

The present invention provides a bonding structure between a bonding pad and a bonding portion of a bonding wire made of an Au-base material, wherein said bonding pad further comprises: a base layer; at least a barrier layer overlying said base layer; and a bonding layer overlying said at least barrier layer, said bonding layer including an Al-base material, and wherein said bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
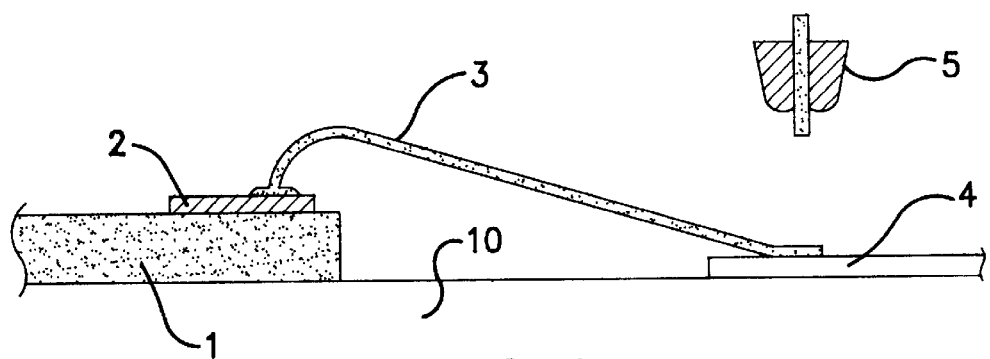
FIG. 1 is a side view of a conventional wire-bonding structure between a bonding pad on a semiconductor device and a lead frame on a printed circuit board.
Figure 2:
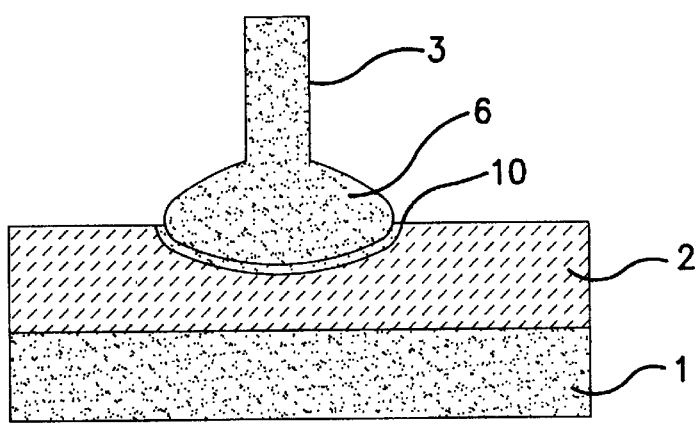
FIG. 2 is a fragmentary cross sectional view of a bonding interface between a bonding wire and a bonding pad immediately after the bonding process and before the high output driving of the semiconductor device.
Figure 3:
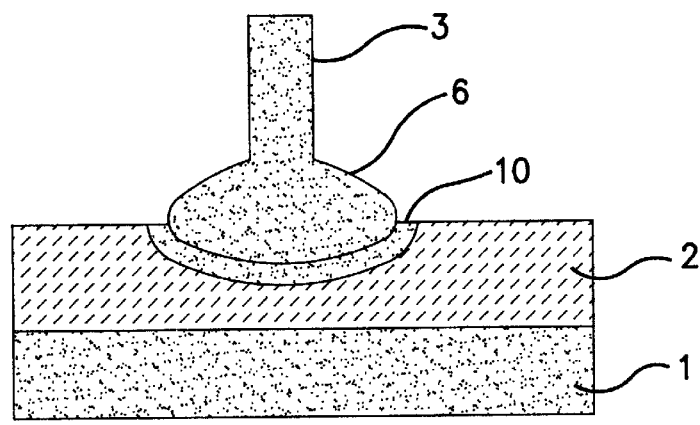
FIG. 3 is a fragmentary cross sectional view of a bonding interface between a bonding wire and a bonding pad after the high output driving of the semiconductor device.

A first aspect of the present invention is a bonding structure between a bonding pad and a bonding portion of a bonding wire made of an Au-base material, wherein said bonding pad further comprises: a base layer; at least a barrier layer overlying said base layer; and a bonding layer overlying said at least barrier layer, said bonding layer including an Al-base material, and wherein said bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

It is preferable that a bottom portion of said Au—Al alloy layer under a bottom of said bonding portion is thinner than side portions of said Au—Al alloy layer adjacent to side portions of said bonding portion.

It is preferable that said at least barrier layer includes at least one of Ti, W, Pt, Ta, Ni, and alloys thereof.

It is preferable that said at least barrier layer has a thickness of at least 200 nanometers.

It is preferable that said at least barrier layer comprises a bottom barrier layer made of Ti and a top barrier layer made of TiN.

It is preferable that said bottom barrier layer and said top barrier layer have respective thicknesses which are at least 100 nanometers.

It is preferable that said bonding layer has a thickness of at most 600 nanometers.

A second aspect of the present invention is a bonding pad comprising: a base layer; at least a barrier layer overlying said base layer; and a bonding layer overlying said at least barrier layer, said bonding layer including an Al-base material, and wherein said at least barrier layer comprises a martial which suppresses a formation of an Al—Au alloy.

It is preferable that said at least barrier layer includes at least one of Ti, W, Pt, Ta, Ni, and alloys thereof.

It is preferable that said at least barrier layer has a thickness of at least 200 nanometers.

It is preferable that said at least barrier layer comprises a bottom barrier layer made of Ti and a top barrier layer made of TiN.

It is preferable that said bottom barrier layer and said top barrier layer have respective thicknesses which are at least 100 nanometers.

It is preferable that said bonding layer has a thickness of at most 600 nanometers.

A third aspect of the present invention is a semiconductor device having at least a bonding pad which is bonded through a bonding wire of an Au-base material to a lead frame of a printed circuit board, on which said semiconductor device is mounted, wherein said bonding pad further comprises: a base layer; at least a barrier layer overlying said base layer; and a bonding layer overlying said at least barrier layer, said bonding layer including an Al-base material, and wherein a bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

It is preferable that a bottom portion of said Au—Al alloy layer under a bottom of said bonding portion is thinner than side portions of said Au—Al alloy layer adjacent to side portions of said bonding portion.

It is preferable that said at least barrier layer includes at least one of Ti, W, Pt, Ta, Ni, and alloys thereof.

It is preferable that said at least barrier layer has a thickness of at least 200 nanometers.

It is preferable that said at least barrier layer comprises a bottom barrier layer made of Ti and a top barrier layer made of TiN.

It is preferable that said bottom barrier layer and said top barrier layer have respective thicknesses which are at least 100 nanometers.

It is preferable that said bonding layer has a thickness of at most 600 nanometers.

A fourth aspect of the present invention is a method of bonding a bonding portion of a bonding wire made of an Au-base material to a bonding pad, said bonding pad further comprising: a base layer; at least a barrier layer overlying said base layer; and a bonding layer overlying said at least barrier layer, said bonding layer including an Al-base material, said method comprising the step of: placing said bonding portion of said bonding wire over said bonding pad; and carrying out a thermal compression bonding, so that said bonding portion of said bonding wire is buried in said bonding layer, and an Au—Al alloy layer is formed on an interface between said bonding portion and said bonding layer, wherein a bottom of said Au—Al alloy layer is in contact with or adjacent to an upper surface of said barrier layer.

It is preferable that a bottom portion of said Au—Al alloy layer under a bottom of said bonding portion is thinner than side portions of said Au—Al alloy layer adjacent to side portions of said bonding portion.

It is preferable that said at least barrier layer includes at least one of Ti, W, Pt, Ta, Ni, and alloys thereof.

It is preferable that said at least barrier layer has a thickness of at least 200 nanometers.

It is preferable that said at least barrier layer comprises a bottom barrier layer made of Ti and a top barrier layer made of TiN.

It is preferable that said bottom barrier layer and said top barrier layer have respective thicknesses which are at least 100 nanometers.

It is preferable that said bonding layer has a thickness of at most 600 nanometers.

Preferred Embodiment

Figure 4:
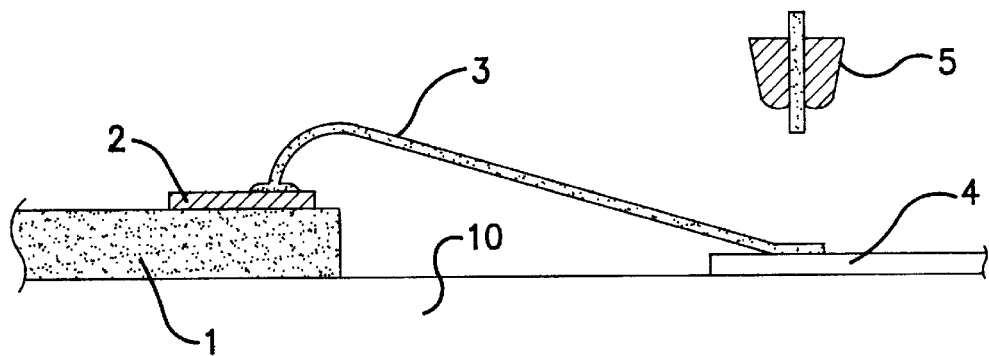
FIG. 4 is a side view of a conventional wire-bonding structure between a bonding pad on a semiconductor device and a lead frame on a printed circuit board in a preferred embodiment in accordance with the present invention.
Figure 5:
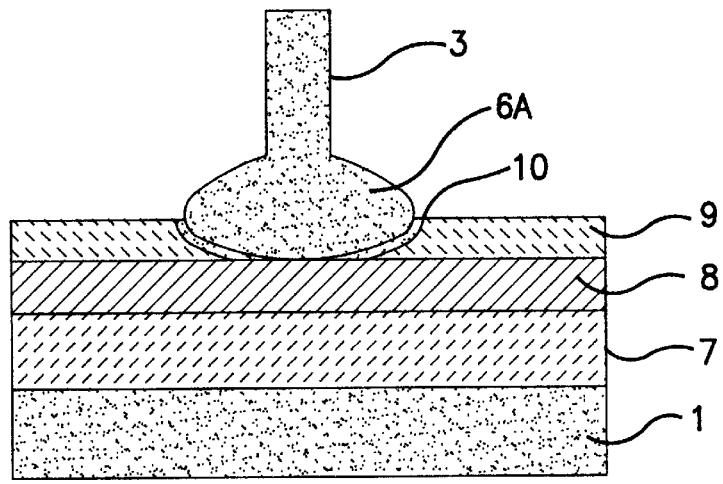
FIG. 5 is a fragmentary cross sectional view of a bonding interface between a bonding wire and a bonding pad immediately after the bonding process and before the high output driving of the semiconductor device in a preferred embodiment in accordance with the present invention.
Figure 6:
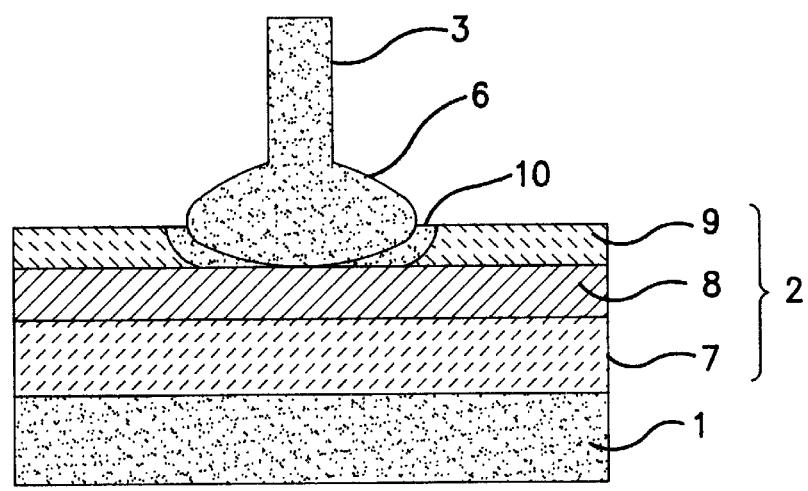
FIG. 6 is a fragmentary cross sectional view of a bonding interface between a bonding wire and a bonding pad after the high output driving of the semiconductor device in a preferred embodiment in accordance with the present invention.

A preferred embodiment according to the present invention will be described in detail with reference to the drawings. FIG. 4 is a side view of a conventional wire-bonding structure between a bonding pad on a semiconductor device and a lead frame on a printed circuit board in a preferred embodiment in accordance with the present invention. FIG. 5 is a fragmentary cross sectional view of a bonding interface between a bonding wire and a bonding pad immediately after the bonding process and before the high output driving of the semiconductor device in a preferred embodiment in accordance with the present invention. FIG. 6 is a fragmentary cross sectional view of a bonding interface between a bonding wire and a bonding pad after the high output driving of the semiconductor device in a preferred embodiment in accordance with the present invention.

As illustrated in FIG. 4, bonding pads 2 having a thickness of about 1 micrometer are provided on a surface of a semiconductor device 1 which is placed on a printed circuit board 10. The bonding pads 2 are bonded through bonding wires 3 to leads frames 4 of the printed circuit board 10. The bonding pads 2 are made of an Al-base material. The bonding wire 3 is made of an Au-base material. The bonding wire 3 has a ball 6 which is bonded with the bonding pad 2 by a thermal compression bonding or an ultrasonic vibration. The bonding wire 3 is further bonded to the lead frame 4 by use of a bonding tool 5.

The ball 6 of the bonding wire 3 digs into the bonding pad 2 by the thermal compression bonding, whereby an Au—Al alloy layer 10 is formed on a bonding interface between the ball 6 of the bonding wire 3 and the bonding pad 2. The bonding pad 2 has a triple-layered structure which comprises laminations of a base layer 7 on a top surface of the semiconductor device 1, a barrier layer 8 on the base layer 7, and a bonding layer 9 on the barrier layer 8. As illustrated in FIG. 5, the ball 6 of the bonding wire 3 digs into the bonding layer 9, wherein an Au—Al alloy layer 10 is formed on the bonding interface between the ball 6 and the bonding layer 9.

The base layer 7 may be made of an Al-base material such as Al, Al-alloy A thickness of the base layer 7 may be substantially the same as a thickness of interconnections of the semiconductor device 1. The thickness of the base layer 7 may, for example, be about 1.4 micrometers. The base layer 7 does not provide any influences to the bonding resistance and the bonding strength, for which reason the material ad the thickness are optional.

The barrier layer 8 may be made of a Ti-base material. For example, the barrier layer 8 may comprise a titanium layer. Alternatively, the barrier layer 8 may comprise a titanium alloy layer, such as a Ti—N alloy layer. Further, alternatively, the barrier layer 8 may comprise laminations of a titanium layer and a titanium alloy layer.

The barrier layer 8 is provided to contact an erosion of the Au—Al alloy layer 10 toward the base layer 7. A thickness of the barrier layer 8 is decided to be sufficient for suppressing or controlling the erosion of the Au—Al alloy layer 10 toward the base layer 7. For example, if the barrier layer 8 comprises laminations of a top Ti layer and a bottom TiN layer, then it is possible that the top Ti layer has a thickness in the range of about 100–200 nanometers and the bottom TiN layer has a thickness of about 100 nanometers. Titanium and titanium compounds are known materials for preventing impurity diffusions.

It is preferable that the thickness of the barrier layer 8 is sufficient for keeping the barrier function even after the barrier layer 8 received a mechanical shock in the bonding process, for which reason the thickness of the barrier layer 8 is thicker than the minimum thickness necessary for controlling the impurity diffusion to the base layer 7. For example, the thickness of the barrier layer 8 is thicker by at least about 200 nanometers than when the minimum necessary thickness of the barrier layer 8 for preventing or controlling the impurity diffusion to the base layer 7.

The bonding layer 9 may be made of the same material as the base layer in view of a possible reduction of the manufacturing cost. Namely, the bonding layer 9 may be made of Al-base material. A thickness of the bonding layer 9 is decided so that a bottom of the ball 6 digging into the bonding layer 9 is positioned near a top surface the barrier layer 8, and a bottom of the Au—Al alloy layer 10 is in contact with or adjacent to the top surface the barrier layer 8. This thickness may depend on the diameter of the bonding wire, and the thermal compression bonding condition.

If the diameter of the Au bonding wire is 25 micrometers, and the thermal compression bonding process is carried out at a temperature of the bonding pad surface of about 200° C. and at a mechanical load of 50 g with an application of a ultrasonic wave power of 20 W for 15 milliseconds, then the thickness of the bonding layer 9 is at most about 600 nanometers. By the thermal compression bonding process under the above conditions, the ball 6 digs the bonding layer 9 but does not reach the barrier layer 8, wherein the bottom of the ball 6 is positioned near a top surface the barrier layer 8, and the bottom of the Au—Al alloy layer 10 is in contact with or adjacent to the top surface the barrier layer 8.

FIG. 6 illustrates the grown Au—Al alloy layer 10 on the bonding interface between the bonding layer 9 and the ball 6 after the high output driving of the semiconductor device at a high temperature for a long time. Under the high temperature condition, the Au—Al alloy layer 10 is grown up to increase the thickness non-uniformly, because the growth in the downward direction of the Au—Al alloy layer 10 is prevented or controlled by the barrier layer 8. The Au—Al alloy layer 10 is limited by the top surface of the barrier layer 8. The Au—Al alloy layer 10 is grown up in lateral directions through the bonding layer 9 but the downward growth of the bottom portion of the Au—Al alloy layer 10 is strictly limited by the top surface of the barrier layer 8. The Au—Al alloy layer 10 is different in thickness, wherein the Au—Al alloy layer 10 under the bottom of the ball 6 is very thin but the Au—Al alloy layer 10 on the side portions of the ball 6 is relatively thick.

A majority of the current, however, flows through the thin part of the Au—Al alloy layer 10 under the bottom of the ball 6, for which reasons the bonding resistance provided by the Au—Al alloy layer 10 is dominated by the thin part thereof under the bottom of the ball 6. Thus, the extremely thin thickness of the Au—Al alloy layer 10 under the bottom of the ball 6 provides a very low resistance, to which the current senses. Namely, the extremely thin thickness of the Au—Al alloy layer 10 under the bottom of the ball 6 provides a very low bonding resistance between the bonding pad 2 and the bonding wire 3. Further, a bonding deterioration also increases the bonding resistance between the bonding pad 2 and the bonding wire 3. Namely, the barrier layer 9 provides an extremely lowly resistive current path through the Au—Al alloy layer 10 between the bonding pad 2 and the bonding wire 3. Since the thickness of the Au—Al alloy layer 10 under the bottom of the ball 6 remains unchanged, then the bonding resistance by the Au—Al alloy layer 10 also substantially remains unchanged.

The barrier layer 8 also provides an additional advantage in increasing the bonding strength between the bonding pad 2 and the bonding wire 3. The Ti-base material for the barrier layer 8 is higher in hardness than the Al-base materials and the Au-base material. Further, as described above, the thickness of the barrier layer 8 is thicker than the minimum necessary thickness for preventing that the Au—Al alloy is formed to reach the base layer 7. For these reasons, the applied ultrasonic power is likely to be propagated to the ball 6 in the thermal compression bonding process.

The thick Ti-based layer is likely to have a micro-irregularity or a small roughness on its surface. The micro-irregularity or the small roughness of the surface of the thick Ti-based layer causes that the overlying bonding layer 9 also has the micro-irregularity or the small roughness on its surface. This provides a desirable effect of increasing the bonding strength between the bonding layer 9 and the ball 6. In the above viewpoints, it is possible to increase the thickness of the barrier layer 8. The surface roughness of the barrier layer 8 depends on the condition for forming the barrier layer 8, such as sputtering process conditions. It is preferable that the thickness of the barrier layer 8 is decided in consideration of both the bonding conditions and the deposition conditions.

The above described novel structure of the bonding pads 2 may be applicable to various cases, provided that the bonding pads are bonded with the Au-based bonding wires by the thermal compression bonding process. The above described novel structure of the bonding pads 2 is suitable for the high output devices, particularly microwave amplifying devices such as Si-MOSFET and GaAs-MESFET.

Figure 7:
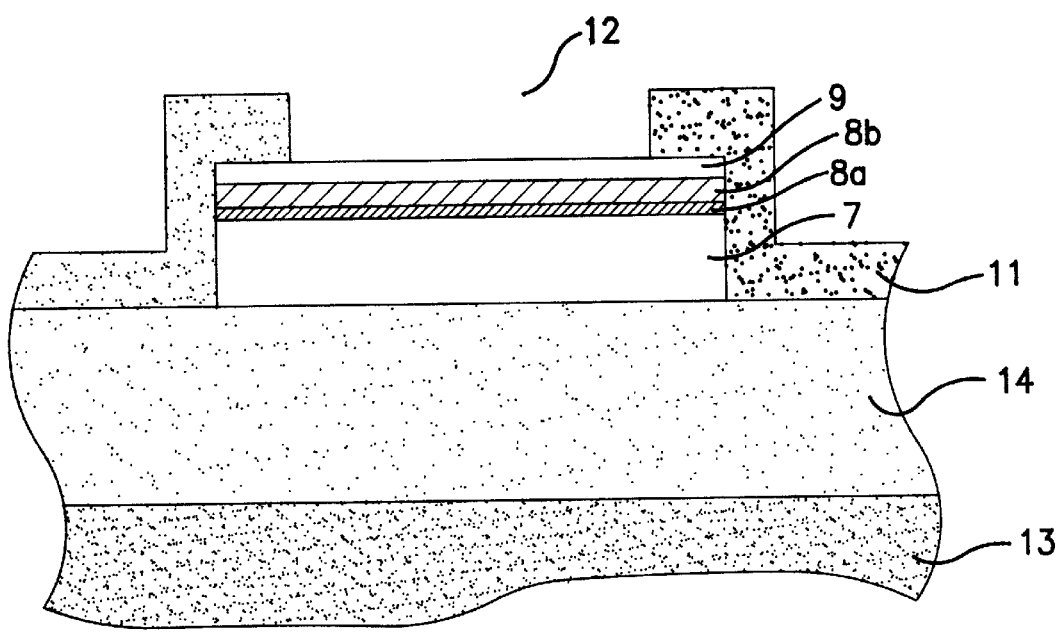
FIG. 7 is a fragmentary cross sectional elevation view illustrative of a novel bonding pad over a semiconductor device in a preferred embodiment in accordance with the present invention.

A preferable example of the above described novel structure of the bonding pad 2 will be described in detail. FIG. 7 is a fragmentary cross sectional elevation view illustrative of a novel bonding pad over a semiconductor device in a preferred embodiment in accordance with the present invention. A semiconductor device having a high output performance is formed over a silicon substrate 13. A silicon dioxide film 14 having a thickness of 3 micrometers overlies a top surface of the silicon substrate 13. A plurality of bonding pads are provided on a top surface of the silicon dioxide film 14. A passivation film 11 of SiON having a thickness of 900 nanometers is provided on the top surface of the silicon dioxide film 14 and also on side walls and top surface peripheral regions of each of the bonding pads 2. A center region of the top surface of each of the bonding pads 2 is exposed to an opening of the passivation film 11.

Each of the bonding pads 2 has the following lamination structures. The bonding pad 2 comprises a base layer 7, a bottom barrier layer 8a, a top barrier layer 8b and a bonding layer 9. The base layer 7 is provided on the silicon dioxide film 14. The base layer 7 is made of AlCu, wherein Al is a base material and Cu is added into the Al-base material. The base layer 7 has a thickness of 1.4 micrometers. The bottom barrier layer 8a overlies the base layer 7. The bottom barrier layer 8a is made of TiN. The bottom barrier layer 8a has a thickness of 100 nanometers. The top barrier layer 8b overlies the bottom barrier layer 8a. The top barrier layer 8b is made of Ti. The top barrier layer 8b has a thickness of 300 nanometers. The bonding layer 9 overlies the top barrier layer 8b. The bonding layer 9 is made of AlCu, wherein Al is a base material and Cu is added into the Al-base material. The bonding layer 9 has a thickness of 350 nanometers.

The above described novel structure of the binding pad may be formed as follows. FIGS. 8A through 8F are fragmentary cross sectional elevation views illustrative of the bonding pad structures in sequential steps involved in the method of forming the bonding pad of FIG. 7 in a preferred embodiment in accordance with the present invention.

Figure 8A:
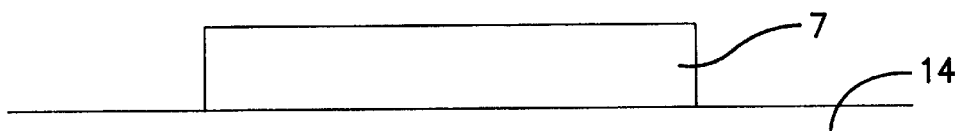
FIGS. 8A through 8F are fragmentary cross sectional elevation views illustrative of the bonding pad structures in sequential steps involved in the method of forming the bonding pad of FIG. 7 in a preferred embodiment in accordance with the present invention.

With reference to FIG. 8A, the base layer 7 made of AlCu is deposited on a top surface of the silicon dioxide layer 14 by a sputtering process for sputtering an AlCu-sputter target. The sputtering process is carried out under conditions of an Ar-gas flow rate of 75 sccm, a sputter power of 16.5 kW, a deposition rate 225 angstroms per second. The deposition is discontinued until the thickness of the base layer 7 becomes 1.4 micrometers.

Figure 8B:
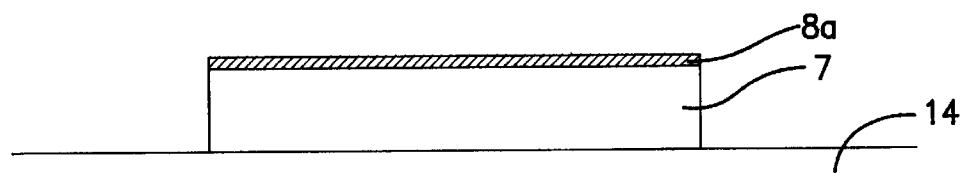

With reference to FIG. 8B, the bottom barrier layer 8a made of TiN is deposited on a top surface of the base layer 7 by a subsequent sputtering process for sputtering a TiN-sputter target. The sputtering process is carried out under conditions of an Ar-gas flow rate of 34 sccm, a sputter power of 9.0 kW, a deposition rate 22 angstroms per second. The deposition is discontinued until the thickness of the bottom barrier layer 8a becomes 100 nanometers.

Figure 8C:
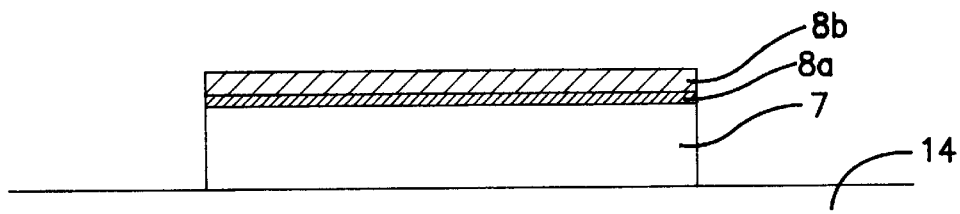

With reference to FIG. 8C, the top barrier layer 8b made of Ti is deposited on a top surface of the bottom barrier layer 8a by a subsequent sputtering process for sputtering a Ti-sputter target. The sputtering process is carried out under conditions of an Ar-gas flow rate of 29 sccm, a sputter power of 1.7 kW, a deposition rate 18 angstroms per second. The deposition is discontinued until the thickness of the top barrier layer 8b becomes 300 nanometers.

Figure 8D:
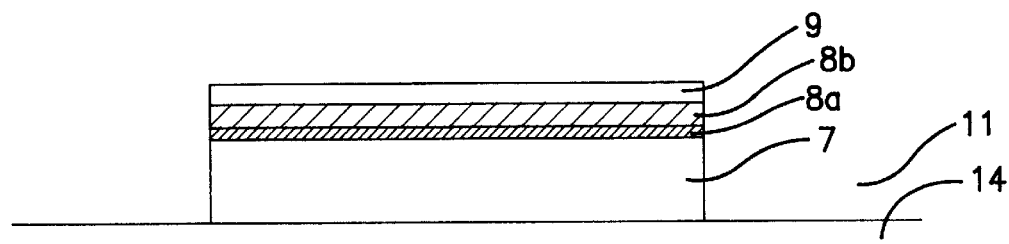

With reference to FIG. 8D, the bonding layer 9 made of AlCu is deposited on a top surface of the top barrier layer 8b by a subsequent sputtering process for sputtering an AlCu-sputter target. The sputtering process is carried out under conditions of an Ar-gas flow rate of 75 sccm, a sputter power of 16.5 kW, a deposition rate 225 angstroms per second. The deposition is discontinued until the thickness of the bonding layer 9 becomes 350 nanometers. As a result, the lamination structure of the bonding pad 2 is completed.

Figure 8E:
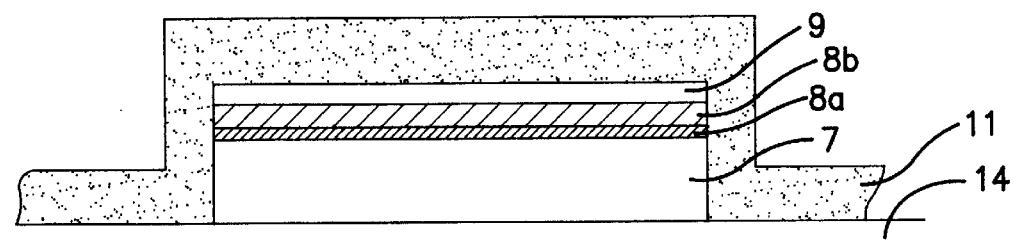

With reference to FIG. 8E, the passivation film 11 made of SiON is deposited by a chemical vapor deposition method, so that the passivation film 11 covers the side walls and the top surface of the bonding pad 2 and the top surface of the silicon dioxide layer 14. The deposition is discontinued until the thickness of the passivation film 11 becomes 900 nanometers.

Figure 8F:
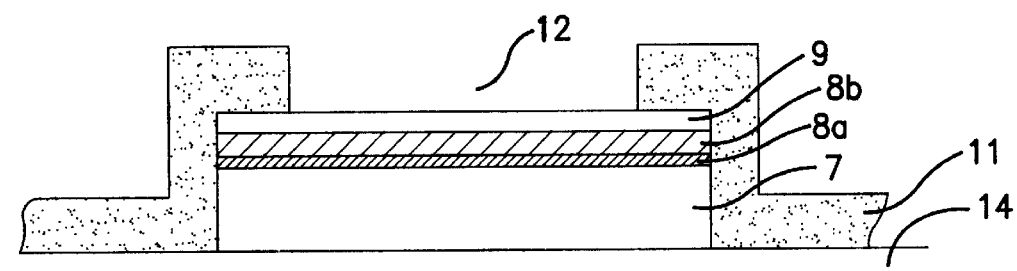

With reference to FIG. 8F, a selective dry etching to the passivation film 11 is carried out to form an opening over a center region of the top surface of the bonding layer 9, thereby obtaining the structure as shown in FIG. 7.

Figure 9:
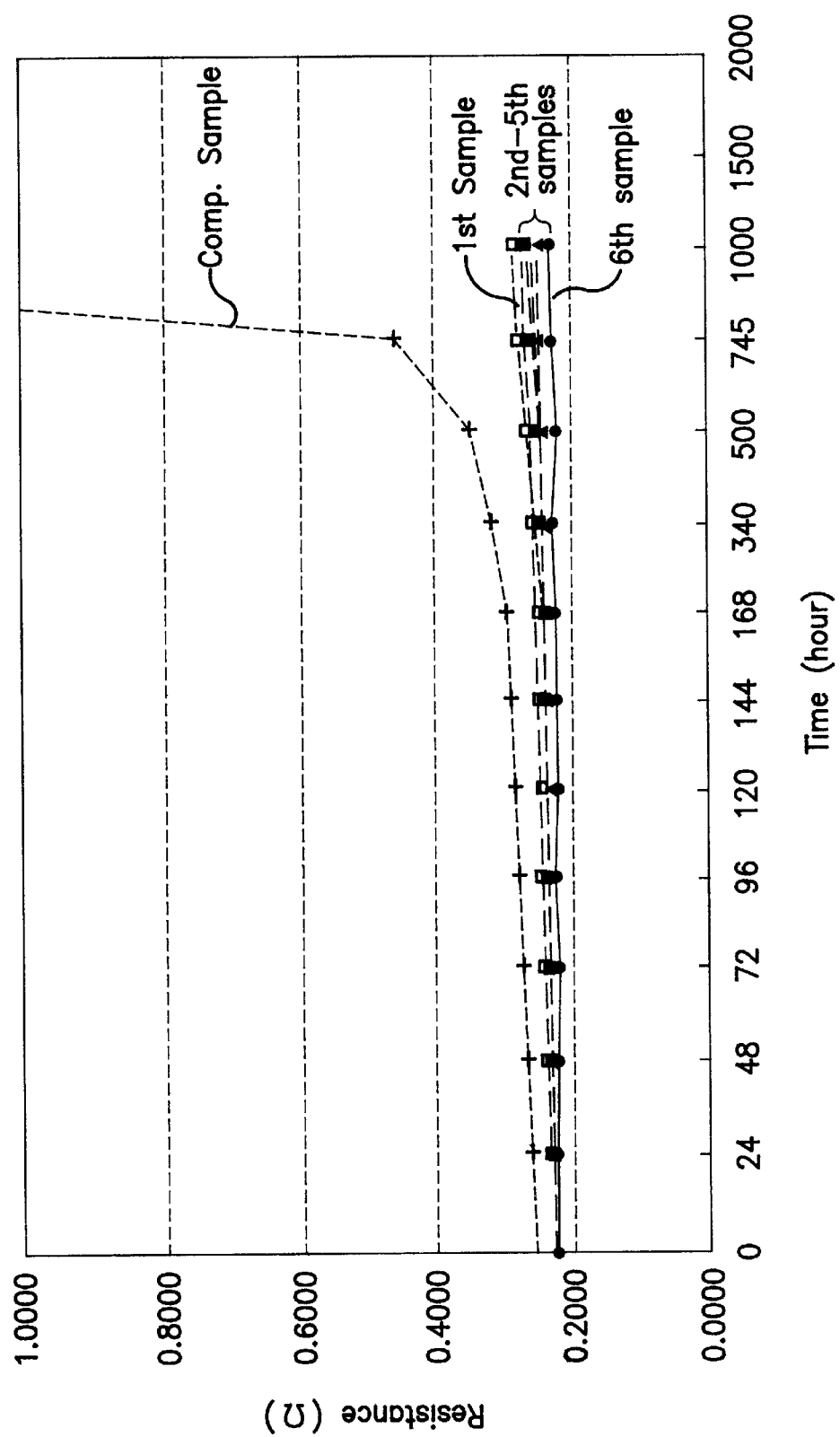
FIG. 9 is a diagram showing respective resistance variations over times of six samples of the semiconductor devices with the different novel bonding pad structures in accordance with the present invention and one example of the semiconductor device with the conventional bonding pad structure of the prior art.
Figure 10:
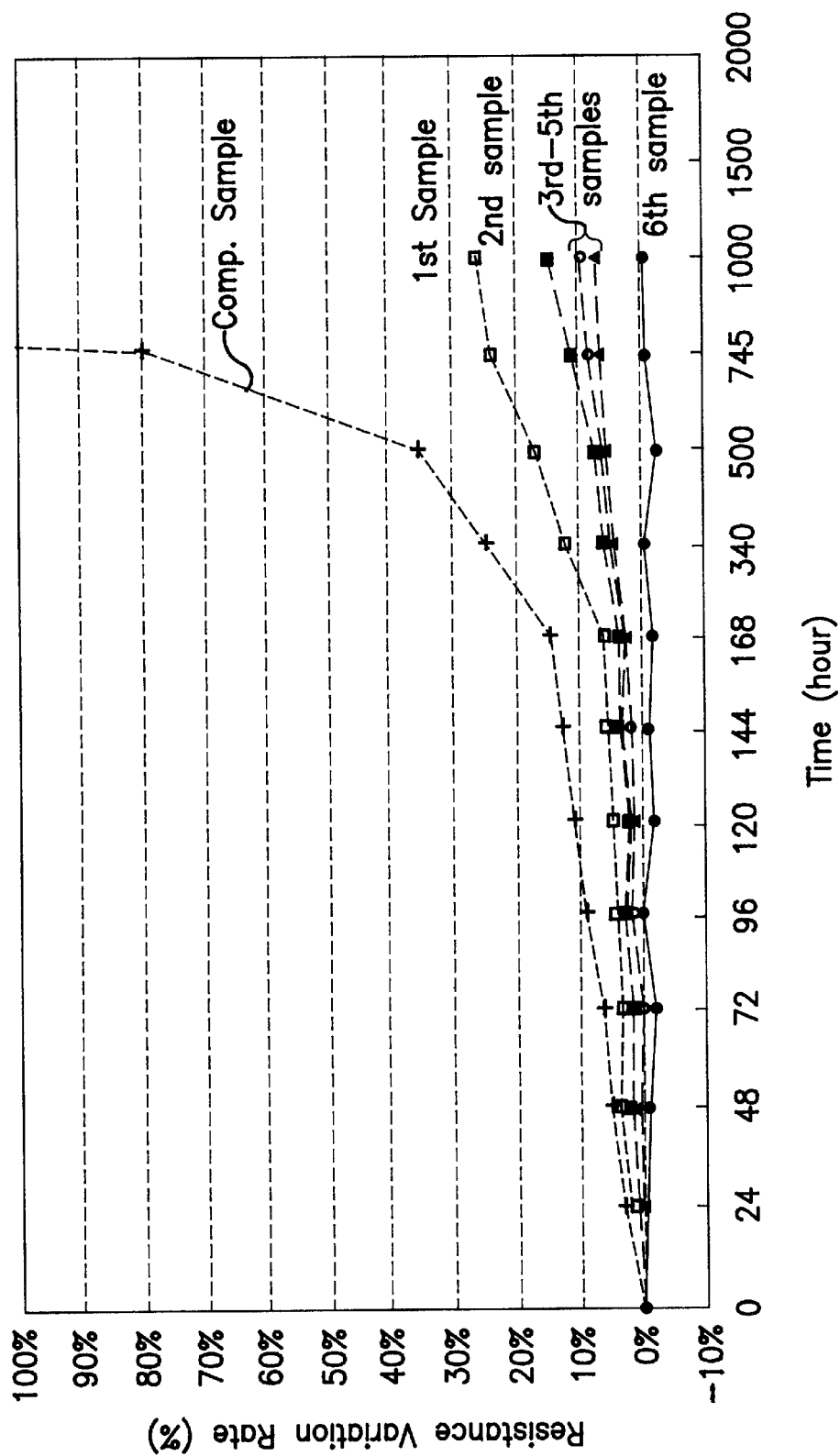
FIG. 10 is a diagram showing respective resistance variation rates over times of six samples of the semiconductor devices with the different novel bonding pad structures in accordance with the present invention and a single comparative sample of the semiconductor device with the conventional bonding pad structure of the prior art.

For the purpose of examination or investigation of the novel structure of the above bonding pad, the above bonding pad was bonded through the bonding wires to the lead frames of the printed circuit board. The semiconductor device was then driven at 250° C. for a long time, during which a resistance between the semiconductor device and the printed circuit board was continuously measured in order to have investigated the variation in the resistance over times. FIG. 9 is a diagram showing respective resistance variations over times of six samples of the semiconductor devices with the different novel bonding pad structures in accordance with the present invention and one example of the semiconductor device with the conventional bonding pad structure of the prior art. FIG. 10 is a diagram showing respective resistance variation rates over times of six samples of the semiconductor devices with the different novel bonding pad structures in accordance with the present invention and a single comparative sample of the semiconductor device with the conventional bonding pad structure of the prior art. The first to sixth samples of the improved bonding pad structures in accordance with the present invention and the comparative sample of the prior art have the following different lamination structures.

The first sample of the improved bond pad has a three-layered structure which comprises an AlCu base layer having a thickness of 1400 nanometers, a TiN single barrier layer having a thickness of 100 nanometers, and an AlCu bonding layer having a thickness of 350 nanometers. The measured resistance values and the measured resistance variation rate values of the first sample are represented by a mark "□".

The second sample of the improved bond pad has a four-layered structure which comprises an AlCu base layer having a thickness of 1400 nanometers, a TiN bottom barrier layer having a thickness of 100 nanometers, a Ti top barrier layer having a thickness of 50 nanometers, and an AlCu bonding layer having a thickness of 350 nanometers. The measured resistance values and the measured resistance variation rate values of the second sample are represented by a mark "■".

The third sample of the improved bond pad has a four-layered structure which comprises an AlCu base layer having a thickness of 1400 nanometers, a TiN bottom barrier layer having a thickness of 100 nanometers, a Ti top barrier layer having a thickness of 100 nanometers, and an AlCu bonding layer having a thickness of 100 nanometers. The measured resistance values and the measured resistance variation rate values of the third sample are represented by a mark "Δ".

The fourth sample of the improved bond pad has a four-layered structure which comprises an AlCu base layer having a thickness of 1400 nanometers, a TiN bottom barrier layer having a thickness of 100 nanometers, a Ti top barrier layer having a thickness of 100 nanometers, and an AlCu bonding layer having a thickness of 350 nanometers. The measured resistance values and the measured resistance variation rate values of the fourth sample are represented by a mark "▲".

The fifth sample of the improved bond pad has a four-layered structure which comprises an AlCu base layer having a thickness of 1400 nanometers, a TiN bottom barrier layer having a thickness of 100 nanometers, a Ti top barrier layer having a thickness of 100 nanometers, and an AlCu bonding layer having a thickness of 600 nanometers. The measured resistance values and the measured resistance variation rate values of the fifth sample are represented by a mark "○".

The sixth sample of the improved bond pad has a four-layered structure which comprises an AlCu base layer having a thickness of 1400 nanometers, a TiN bottom barrier layer having a thickness of 100 nanometers, a Ti top barrier layer having a thickness of 300 nanometers, and an AlCu bonding layer having a thickness of 350 nanometers. The measured resistance values and the measured resistance variation rate values of the sixth sample are represented by a mark "●".

The comparative sample of the conventional bond pad has a single-layered structure which comprises an AlCu layer having a thickness of 1400 nanometers. The measured resistance values and the measured resistance variation rate values of the comparative sample are represented by a mark "- -".

For each of the above first to sixth samples and the comparative sample, five products were prepared to measure the resistance values and the resistance variation rate values, so that an averaged value of the five measured resistance values of the five products was obtained, and an averaged value of the five measured resistance variation rate values of the five products was obtained.

For the comparative sample represented by the mark "- -", the resistance value gradually increases until the time reaches 500 hours. The resistance value, however, remarkably increases as the time passes over 500 hours. The resistance variation rate value gradually increases until the time reaches 340 hours. The resistance variation rate value, however, remarkably increases as the time passes over 340 hours.

For the first sample represented by the mark "□", the resistance value substantially remains unchanged over times. The resistance variation rate value also substantially remains unchanged until the time reaches 168 hours, and gradually increases as the time passes over 168 hours.

For the second sample represented by the mark "■", the resistance value substantially remains unchanged over times. The resistance variation rate value also substantially remains unchanged until the time reaches 500 hours, and slightly increases as the time passes over 500 hours.

For the third sample represented by the mark "Δ", the resistance value substantially remains unchanged over times. The resistance variation rate value also substantially remains unchanged over times.

For the fourth sample represented by the mark "▲", the resistance value substantially remains unchanged over times. The resistance variation rate value also substantially remains unchanged over times.

For the fifth sample represented by the mark "○", the resistance value substantially remains unchanged over times. The resistance variation rate value also substantially remains unchanged over times.

For the sixth sample represented by the mark "●", the resistance value substantially remains unchanged over times. The resistance variation rate value also substantially remains unchanged over times.

An inter-relationship between the resistance value and the total thickness of the barrier layers is, hereby, investigated with reference to FIG. 9. Over times, the first sample represented by the mark "□", is higher in resistance value than the second, third, fourth and fifth samples represented by the marks "■" "Δ" "▲" and "○". The sixth sample represented by the mark "●" is lower in resistance value than the second, third, fourth and fifth samples represented by the marks "■" "Δ" "▲" and "○". In the first sample, the total thickness of the barrier layer is 100 nanometers. In the second sample, the total thickness of the top and bottom barrier layers is 150 nanometers. In the third, fourth and fifth samples, the total thickness of the top and bottom barrier layers is 200 nanometers. In the sixth sample, the total thickness of the top and bottom barrier layers is 400 nanometers. As the total thickness of the barrier layers is large, the increment of the resistance value is low. Namely, the increase in the total thickness of the barrier layers keeps the resistance value to be low.

Another inter-relationship between the resistance variation rate value and the total thickness of the barrier layers is subsequently investigated with reference to FIG. 10. Over times, the first sample represented by the mark "□" is higher in resistance value than the second sample represented by the marks "■". The second sample represented by the marks "■" is higher in resistance value than the third, fourth and fifth samples represented by the marks "Δ" "▲" and "○". The sixth sample represented by the mark "●" is lower in resistance value than the third, fourth and fifth samples represented by the marks "Δ" "▲" and "○". In the first sample, the total thickness of the barrier layer is 100 nanometers. In the second sample, the total thickness of the top and bottom barrier layers is 150 nanometers. In the third, fourth and fifth samples, the total thickness of the top and bottom barrier layers is 200 nanometers. In the sixth sample, the total thickness of the top and bottom barrier layers is 400 nanometers. As the total thickness of the barrier layers is large, the resistance variation rate value is low. Namely, the increase in the total thickness of the barrier layers keeps the resistance variation rate value to be low.

Still another inter-relationship between the resistance value and the thickness of the bonding layer is subsequently investigated with reference to FIG. 9. The third, fourth and fifth samples have the same total thickness of the barrier layers, for which reason these three samples are compared to each other. Over times, the third, fourth and fifth samples represented by the marks "Δ" "▲" and "○" have almost the same resistance values. In the third sample, the thickness of the bonding layer is 100 nanometers. In the fourth sample, the thickness of the bonding layer is 350 nanometers. In the fifth sample, the thickness of the bonding layer is 600 nanometers. In the range of the bonding layer thickness from 100 nanometers to 600 nanometers, the resistance value is independent from the bonding layer thickness.

Yet another inter-relationship between the resistance variation rate value and the thickness of the bonding layer is subsequently investigated with reference to FIG. 10. The third, fourth and fifth samples have the same total thickness of the barrier layers, for which reason these three samples are compared to each other. Over times, the third, fourth and fifth samples represented by the marks "Δ" "▲" and "○" have almost the same resistance values. In the third sample, the thickness of the bonding layer is 100 nanometers. In the fourth sample, the thickness of the bonding layer is 350 nanometers. In the fifth sample, the thickness of the bonding layer is 600 nanometers. In the range of the bonding layer thickness from 100 nanometers to 600 nanometers, the resistance variation rate value is independent from the bonding layer thickness.

In addition, the respective bonding strengths of the first to fifth samples and the comparative sample were investigated by a tensile strength test. For each of the above first, second, fourth and fifth samples and the comparative sample, four products were prepared to measure the tensile strengths. For the third sample, three products were prepared to measure the tensile strengths.

As results of the tensile strength test to the first sample, three products showed the peel of the bonding wire from the surface of the bonding pad at respective strength values of 5.4 g, 5.8 g and 6.8 g. One product showed the disconnection of the loop-top of the bonding wire at a strength value of 9.0 g.

As results of the tensile strength test to the second sample, one product showed the peel of the bonding wire from the surface of the bonding pad at a strength value of 4.7 g. Two products showed the disconnection of the bonding wire near its expanded portion having a ball-shape at the same strength value of 8.5 g. One product showed the disconnection of the loop-top of the bonding wire at a strength value of 9.4 g.

As results of the tensile strength test to the third sample, one product showed the peel of the bonding wire from the surface of the bonding pad at a strength value of 8.2 g. The remaining two products showed the disconnection of the loop-top of the bonding wire at respective strength values of 9.2 g and 9.8 g.

As results of the tensile strength test to the fourth sample, all products showed the disconnection of the loop-top of the bonding wire at respective strength values of 8.2 g, 8.3 g, 8.7 g and 9.0 g.

As results of the tensile strength test to the fifth sample, all products showed the disconnection of the loop-top of the bonding wire at respective strength values of 8.3 g, 8.5 g, 9.0 g and 9.4 g.

As results of the tensile strength test to the comparative sample, all products showed the peel of the bonding wire from the surface of the bonding pad at respective strength values of 1.2 g, 5.8 g, 6.6 g and 7.4 g.

The disconnection of the loop-top of the bonding wire means that the bonding wire is very well and securely bonded with the bonding pad. This further means that the lamination structure of the bonding pad is suitable very much for securely bonding the bonding wire with the bonding pad. In this case, if the measured tensile strength value is high, this means that the bonding strength between the bonding wire and the bonding pad is high, and also the tensile strength of the bonding wire is also high and the tensile strength at the position near the ball-shaped expanded portion of the bonding wire is also high. If the measured tensile strength value is low, this means that the tensile strength of the bonding wire is also low, but does not means that the bonding strength between the bonding wire and the bonding pad is low.

The disconnection of the bonding wire near its expanded portion having the ball-shape means that the bonding wire is well bonded with the bonding pad. This further means that the lamination structure of the bonding pad is suitable for securely bonding the bonding wire with the bonding pad. In this case, if the measured tensile strength value is high, this means that the bonding strength between the bonding wire and the bonding pad is high, and also the tensile strength at the position near the ball-shaped expanded portion of the bonding wire is also high. If the measured tensile strength value is low, this means that the tensile strength at the position near the ball-shaped expanded portion of the bonding wire is low, but does not means that the bonding strength between the bonding wire and the bonding pad is low.

The peel of the bonding wire from the surface of the bonding pad means that the bonding wire is not good bonded with the bonding pad. This further means that the lamination structure of the bonding pad is unsuitable for securely bonding the bonding wire with the bonding pad.

Therefore, the fourth and fifth samples showed the better performances in the bonding strength between the bonding wire and the bonding pad. The first sample showed the non-good performance in the bonding strength between the bonding wire and the bonding pad. The bonding strength between the bonding wire and the bonding pad well depends on the thickness of the barrier layer. A large bonding strength between the bonding wire and the bonding pad well is likely to depend on the large thickness of the barrier layer. For example, a preferable thickness of the barrier layer may be at least 200 nanometers in view of the sufficient bonding strength between the bonding wire and the bonding pad.

From the above examinations, it could be understand that it is preferable that the bonding pad has the lamination structure comprising the base layer 7, the barrier layer 8 and the bonding layer 9, wherein the thickness of the barrier layer 8 is sufficiently thick for preventing that the Au—Al alloy layer 10 is grown to reach the base layer 7, and also the bonding layer 9 has such a thickness that the bottom of the Au—Al alloy layer 10 is in contact with or adjacent to the upper surface of the barrier layer 8, whereby the barrier layer may prevents a further vertical growth of the Au—Al alloy layer 10 in a direction vertical to the upper surface of the barrier layer 8 under a high temperature condition, and the Au—Al alloy layer 10 has a thin portion which underlies the bottom of the ball 6 of the bonding wire 3 and overlies the upper surface of the barrier layer 8. As a result, the increase in the bonding resistance of the thin portion of the Au—Al alloy layer 10 between the bonding wire 3 and the bonding pad 2 is prevented. This allows the semiconductor device to have a high reliability for a long term.

Further, the barrier layer 8 is so deposited as to have a large thickness with a rough surface and also to allow an efficient application of the thermal compression force to the ball 6 of the bonding wire 3, thereby to obtain a large bonding strength between the bonding wire 3 and the bonding pad 2.

In the above preferred embodiment, the barrier layer 8 is made of the Ti-base material. Any other materials may also be available if preventing that the Au—Al alloy layer 10 is grown to reach the base layer 7 and also having a sufficient hardness for allowing the efficient application of the thermal compression force to the ball 6 of the bonding wire 3. For example, W-base materials, Pt-base materials, Ta-base materials, and Ni-base materials are also available.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A bonding structure between a bonding pad and a bonding portion of a bonding wire made of an Au-base material, wherein said bonding pad further comprises:
   a base layer;
   at least a barrier layer overlying said base layer; and
   a bonding layer overlying said at least barrier layer, said bonding layer including an Al-base material, and
   wherein said bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

2. The bonding structure as claimed in claim 1, wherein a bottom portion of said Au—Al alloy layer under a bottom of said bonding portion is thinner than side portions of said Au—Al alloy layer adjacent to side portions of said bonding portion.

3. The bonding structure as claimed in claim 1, wherein said at least barrier layer includes at least one of Ti, W, Pt, Ta, Ni, and alloys thereof.

4. The bonding structure as claimed in claim 1, wherein said at least barrier layer has a thickness of at least 200 nanometers.

5. The bonding structure as claimed in claim 1, wherein said at least barrier layer comprises a bottom barrier layer made of Ti and a top barrier layer made of TiN.

6. The bonding structure as claimed in claim 5, wherein said bottom barrier layer and said top barrier layer have respective thicknesses which are at least 100 nanometers.

7. The bonding structure as claimed in claim 1, wherein said bonding layer has a thickness of at most 600 nanometers.

8. A bonding pad comprising:
   a base layer;
   at least a barrier layer having a thickness of at least 200 nanometers overlying said base layer; and
   a bonding layer overlaying said at least barrier layer, said bonding layer including an Al-base material, and
   wherein said at least barrier layer comprises a material which suppresses a formation of an Al—Au alloy.

9. The bonding structure as claimed in claim 8, wherein said at least barrier layer includes at least one of Ti, W, Pt, Ta, Ni, and alloys thereof.

10. The bonding structure as claimed in claim 8, wherein said at least barrier layer comprises a bottom barrier layer made of Ti and a top barrier layer made of TiN.

11. The bonding structure as claimed in claim 10, wherein said bottom barrier layer and said top barrier layer have respective thicknesses which are at least 100 nanometers.

12. The bonding structure as claimed in claim 8, wherein said bonding layer has a thickness of at most 600 nanometers.

13. A semiconductor device having at least a bonding pad which is bonded through a bonding wire of an Au-base material to a lead frame of a printed circuit board, on which said semiconductor device is mounted, wherein said bonding pad further comprises:
   a base layer;
   at least a barrier layer overlying said base layer; and
   a bonding layer overlying said at least barrier layer, said bonding layer including an Al-base material, and
   wherein a bonding portion of said bonding wire is buried in said bonding layer, and an Au—Al alloy layer extends on an interface between said bonding portion and said bonding layer, and a bottom of said Au—Al alloy layer is in contact with or adjacent to an upper surface of said barrier layer.

14. The semiconductor device as claimed in claim 13, wherein a bottom portion of said Au—Al alloy layer under a bottom of said bonding portion is thinner than side portions of said Au—Al alloy layer adjacent to side portions of said bonding portion.

15. The semiconductor device as claimed in claim 13, wherein said at least barrier layer includes at least one of Ti, W, Pt, Ta, Ni, and alloys thereof.

16. The semiconductor device as claimed in claim 13, wherein said at least barrier layer has a thickness of at least 200 nanometers.

17. The semiconductor device as claimed in claim 13, wherein said at least barrier layer comprises a bottom barrier layer made of Ti and a top barrier layer made of TiN.

18. The semiconductor device as claimed in claim 17, wherein said bottom barrier layer and said top barrier layer have respective thicknesses which are at least 100 nanometers.

19. The semiconductor device as claimed in claim 13, wherein said bonding layer has a thickness of at most 600 nanometers.

* * * * *